(12) United States Patent
Ni et al.

(10) Patent No.: US 7,218,114 B2
(45) Date of Patent: May 15, 2007

(54) SHIMMED MAGNETIC RESONANCE IMAGING APPARATUS AND SHIMMING METHOD THEREFOR

(75) Inventors: Cheng Ni, Shenzhen (CN); Hui Cao, Shenyang (CN); Jin Jun Chen, Shenzhen (CN); Zhong You Ren, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/394,629

(22) Filed: Mar. 31, 2006

(65) Prior Publication Data

US 2006/0244451 A1 Nov. 2, 2006

(30) Foreign Application Priority Data

Mar. 31, 2005 (CN) ............... 2005 1 0059757

(51) Int. Cl.
*G01V 3/00* (2006.01)
(52) U.S. Cl. ..................................... 324/321
(58) Field of Classification Search ........... 324/320
See application file for complete search history.

(56) References Cited

U.S. PATENT DOCUMENTS

| | | | | |
|---|---|---|---|---|
| 5,045,794 A | * | 9/1991 | Dorri et al. | 324/320 |
| 5,396,207 A | * | 3/1995 | Dorri et al. | 335/216 |
| 5,418,462 A | * | 5/1995 | Breneman et al. | 324/320 |
| 5,568,102 A | * | 10/1996 | Dorri et al. | 335/216 |
| 5,596,303 A | * | 1/1997 | Akgun et al. | 335/216 |
| 5,677,630 A | * | 10/1997 | Laskaris et al. | 324/320 |
| 5,677,854 A | * | 10/1997 | Dorri | 703/5 |
| 5,760,585 A | * | 6/1998 | Dorri | 324/320 |
| 6,181,137 B1 | * | 1/2001 | Havens et al. | 324/320 |
| 6,819,108 B2 | * | 11/2004 | Huang et al. | 324/320 |

* cited by examiner

*Primary Examiner*—Brij Shrivastav
*Assistant Examiner*—Megann E Vaughn
(74) *Attorney, Agent, or Firm*—Schiff Hardin LLP

(57) ABSTRACT

In a shimming method for an irregular object to be examined by magnetic resonant equipment magnetic field parameters are measured at measurement points located on the surface of an irregular object to be examined. Based on the measured magnetic field parameters, the positions and number of shims for adjusting magnetic field homogeneity are calculated when a passive shimming is to be performed, or the current value in a shimming coil are calculated when an active shimming is to be performed, or at the same time both the positions and number of shims and current value in the shimming coil are calculated when active shimming and passive shimming are to be performed at the same time. Shimming is then performed according to the calculated results. These above steps are repeated until achieving required magnetic field homogeneity. Since the homogeneous region is designed to have an irregular shape, it can provide a better coverage of the irregular object to be examined, and at the same time it reduces the shimming constraints to the unnecessary regions outside the irregular object to be examined, therefore avoiding shimming in those unnecessary regions.

9 Claims, 7 Drawing Sheets

SHIMMED MAGNETIC RESONANCE IMAGING APPARATUS AND SHIMMING METHOD THEREFOR

BACKGROUND OF THE INVENTION

1. Field of the Invention

The present invention relates to a shimmed magnetic resonance imaging apparatus and method for shimming magnetic resonant equipment, particularly a shimming method for an irregular object to be examined by magnetic resonant equipment.

2. Description of the Prior Art

In magnetic resonant equipment, the degree of magnetic field homogeneity has direct influence on the image quality. Within a scan region, the larger the homogeneous region, the better the image quality. Conventionally, in order to achieve a larger homogeneous region, the size, complexity and weight of magnetic resonant equipment (scanners) have been increased dramatically, leading to a significant increase in costs.

At the same time, due to the above reason, the size increase of the magnetic resonant equipment leads to reduced openness, therefore to restriction as to the applications for such scanners.

For an open and flat magnet, such as a C-shaped magnet, in order to reduce the effect of claustrophobia, the open distance (spacing) should be designed as large as possible. In such magnetic resonant equipment, when a patient lies down on a scanning bed, the distance from the patient to the upper magnetic pole is far more than the distance to the lower magnetic pole so as to improve the openness effect. In other words, the patient is not in the middle between the two magnetic poles but is closer to the lower magnetic pole.

Although during the design stage the magnets are made as homogeneous as possible, the magnetic field homogeneity produced by the manufactured magnets is usually not as good as expected, so the final magnetic field homogeneity has to be achieved by shimming, such as by adding soft magnetic or hard magnetic shims onto the magnetic poles. In order to correct the spatial inhomogeneity in a magnetic field, the shim size should be as small as possible. Small shims, however, generate in their vicinity a spatial inhomogeneity of higher powers, which makes it very difficult to perform shimming close to a magnetic pole.

For a hollow, cylindrical and horizontal magnet, in order to reduce the effect of claustrophobia, a patient usually lies in a bed closer to the lower side of the hollow channel, so as to increase the patient's distance to the upper side of the hollow channel. The magnetic field homogeneity of the manufactured magnet again is not as homogeneous as by theoretical calculation, so the final homogeneity also has to be achieved by shimming, such as by inserting shims into pre-made grooves on the periphery of the hollow channel.

For flat magnets, the homogeneous region is usually designed at a position that is symmetrical relative to the upper and lower magnetic poles, but for a hollow cylindrical magnet, the homogeneous region is designed at a position symmetrical relative to the cylindrical axis. In the prior art, the following methods are usually used to improve magnetic field homogeneity in magnetic resonance imaging systems:

(1) The magnets are produced with a more optimized design, for example by optimizing the source for generating the magnetic field and the magnetic circuit so as to achieve a better and bigger homogeneous region, and this method is intended to improve the overall homogeneity of the magnetic field;

(2) Shimming is performed for an ellipsoidal volume instead of a spherical volume, which leads to reduced shimming requirements in the short axis direction of the ellipsoid;

(3) The requirements for the field homogeneity are reduced by designing different imaging sequences.

Referring to FIG. 1, in the prior art the homogeneous region of the magnetic field is usually a spherical homogeneous region 300 or an ellipsoidal homogeneous region 400. Because a patient to be scanned has the shape of an irregular object to be examined 200, and as mentioned above, the patient is usually positioned closer to the lower magnetic pole and farther away from the upper magnetic pole, therefore the patient is not located at the middle position of the homogeneous region formed between the upper and lower magnetic poles. In order to cover the area below the irregular object to be examined 200, the volume of this spherical shaped homogeneous region 300 or the ellipsoidal shaped homogeneous region 400 has to be big enough, which means a great increase of the homogeneous region that is not within the image scanning area and that has no contribution to the image quality.

Therefore, in the above schemes, the magnet design optimization improves the magnetic field's overall homogeneity to a certain degree, but cannot solve the problem of creating redundant homogeneous regions having no contribution to image quality. The use of an ellipsoidal shaped field region instead of a spherical shaped field region for shimming can reduce the homogeneous regions having no contribution to image quality to a certain degree, but this still is not sufficient when scanning an irregular object to be examined that has a more complicated shape. Designing different imaging sequences to reduce requirements to field homogeneity can reduce equipment costs, but nevertheless cannot solve the problem of non-contributing homogeneous regions, and the use of different imaging sequences leads to long acquisition times and slow image formation speed.

SUMMARY OF THE INVENTION

An object of this invention is to provide a shimming method which can effectively cover a target of an irregular object to be examined by magnetic resonant equipment.

Another object of this invention is to provide a shimming method for an irregular object to be examined by magnetic resonant equipment for increasing an effective image forming region and at the same time without increasing the equipment size, weight, complexity and costs.

The above objects are achieved in accordance with the invention by a shimming method for an irregular object to be examined by magnetic resonant equipment, including the following steps:

(1) Measuring magnetic field parameters at measurement points located on the surface of an irregular object to be examined;

(2) Based on the measured magnetic field parameters, calculating the positions and number of shims for adjusting magnetic field homogeneity when a passive shimming is to be performed, or, calculating the current value in a shimming coil when an active shimming is to be performed, or calculating at the same time both the positions and number of shims and the current value in the shimming coil when active shimming and passive shimming are to be performed at the same time;

(3) Performing shimming according to the calculated results; and (4) Repeating the steps (1) through (3) until achieving a required (predetermined) magnetic field homogeneity.

The shims can be soft and/or hard magnetic material shims. The shape of the homogeneous region covering the irregular object to be examined is selected from any of spherical, ellipsoidal and irregular shapes. The upper and lower parts of the homogeneous region can be set as a flat top and a flat bottom, respectively, which have a cross-sectional shape selected from any of circular, elliptical and irregular shapes. The measurement points can be set on the surface of the homogeneous region and on the surface of the flat top and flat bottom.

The magnetic field parameters can include field variation, an ellipsoidal harmonic factor, a spherical harmonic factor and magnetic field peak-to-peak value, and these magnetic field parameters can be used in the calculation individually, in combination, as a target function and as a constraint (limit value), wherein the calculation is a mathematical optimization method, such as a linear programming method.

By using the shimming method for an irregular object to be examined by magnetic resonant equipment according to the invention to design the homogeneous region, the following advantages can be achieved:

(1) Since the homogenous region is designed as an irregular shape, it can therefore provide a better coverage of the irregular object to be examined, and at the same time reduce shimming constraint in unnecessary regions outside the irregular object to be examined, thus it avoids performing shimming to the unnecessary regions, which helps to improve the magnetic field homogeneity within the region of the irregular object to be examined, so as to improve the image quality.

(2) The volume reduction of the homogeneous region, it leads to the reduction or decrease of the size, weight and complexity of the magnets in the magnetic resonant equipment, therefore its openness is improved and also the manufacturing costs of the magnetic resonant equipment is reduced accordingly.

(3) Since the homogeneous regions outside the image region, which have no contribution to the image quality, are eliminated, the magnetic field homogeneity within the irregular homogeneous region more accurately reflects the influence on the image quality by the field homogeneity.

DESCRIPTION OF THE PREFERRED EMBODIMENTS

Figure 1:
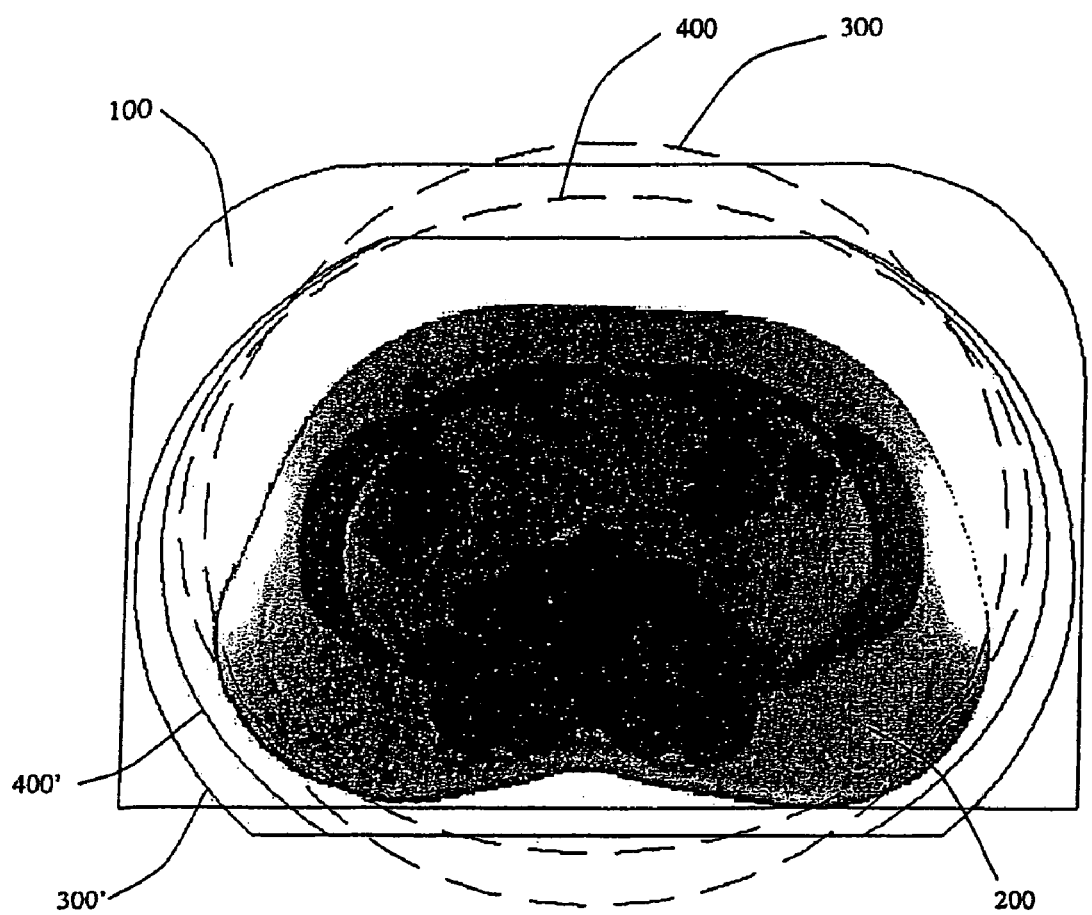
FIG. 1 is a schematic drawing for a comparison between the homogeneous region of the shimming method for an irregular object to be examined by magnetic resonant equipment according to the invention, and the homogeneous region of prior art.

Referring to FIG. 1, an irregular object to be examined 200, which is to be scanned, such as a patient or a part thereof, is located in a coil 100. According to the shimming method of the invention for an irregular object to be examined by magnetic resonant equipment, the shape of a homogeneous region is designed as irregular regions 300', 400' so as to have a more effective coverage of the irregular object to be examined 200, and to reduce those homogeneous regions not inside the scan image region and having no contribution to the image quality.

Figure 2A:
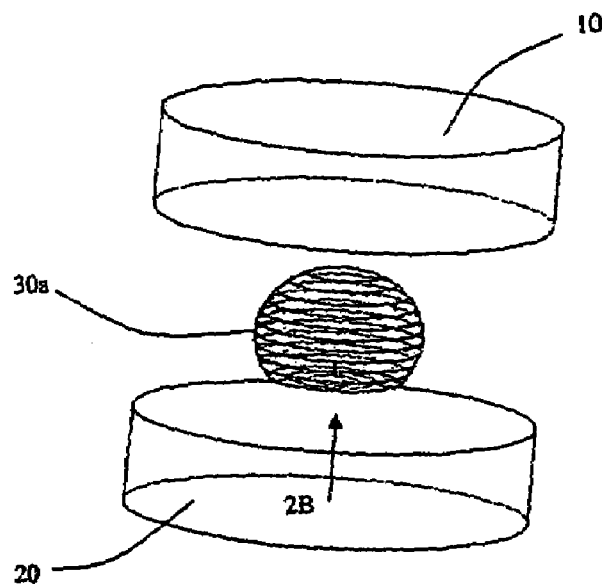
FIGS. 2A–2C are schematic diagrams of a first embodiment of the shimming method for an irregular object to be examined by magnetic resonant equipment according to the invention.
Figure 2B:
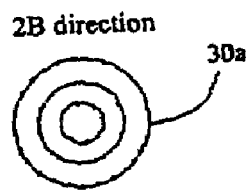
Figure 2C:
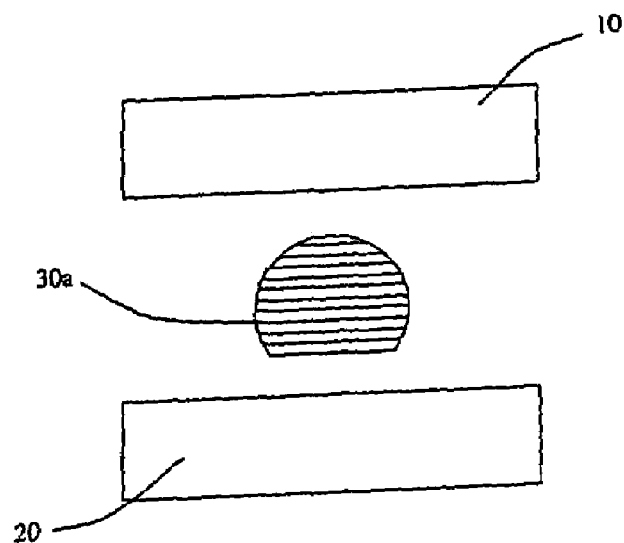

FIGS. 2A–2C show a first embodiment of the shimming method for an irregular object to be examined by magnetic resonant equipment according to the invention. FIG. 2A is a perspective view of the first embodiment of the shimming method for an irregular object to be examined by magnetic resonant equipment according to the invention. FIG. 2B is a view in the direction 2B in FIG. 2A. FIG. 2C is a cross-sectional view of FIG. 2A.

In FIG. 2A, a homogeneous region 30a is formed between an upper magnetic pole 10 and a lower magnetic pole 20. This homogeneous region 30a includes a number of slices parallel with the upper and lower magnetic poles 10, 20. In order to measure the magnetic field on the surface of the irregular object to be examined, a number of measurement points are set at intervals on the surface of the slice planes of this homogeneous region 30a. (Also refer to FIGS. 2B and 2C.) This homogeneous region 30a generally has a spherical shape. By considering the fact that the back side of this irregular object to be examined (a patient to be scanned) is close to flat because it is on a platform (hospital bed), the lower part of this spherical shaped homogeneous region 30a is therefore designed with a flat bottom with a circular shape, so as to have a more effective coverage of the irregular object to be examined. As shown in FIG. 2B, a number of measurement points are set on the surface of the flat bottom of the spherical shaped homogeneous region 30a in order to measure its magnetic parameters.

Figure 3A:
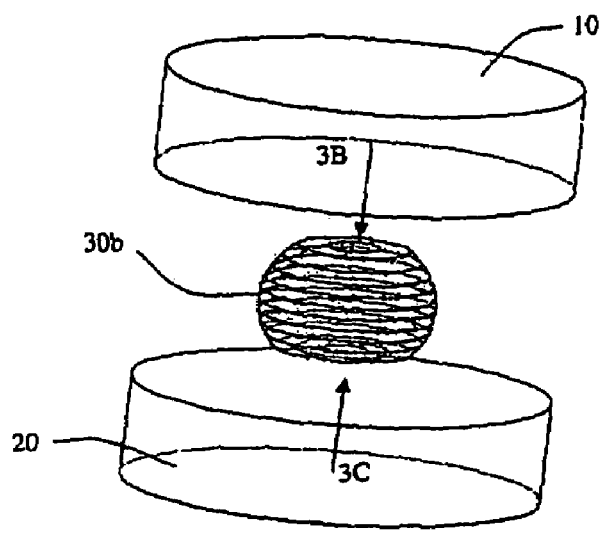
FIGS. 3A–3D are schematic diagrams of a second embodiment of the shimming method for an irregular object to be examined by magnetic resonant equipment according to the invention.
Figure 3B:
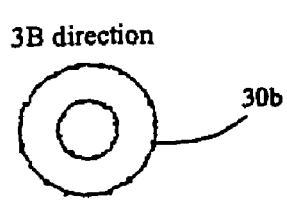
Figure 3C:
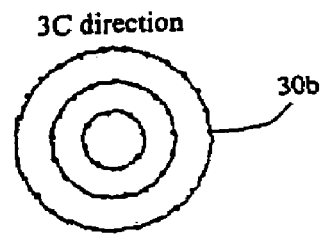
Figure 3D:
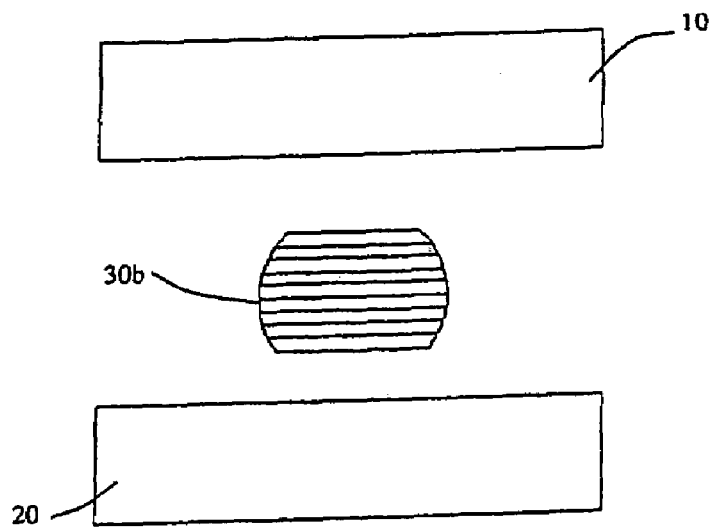

FIGS. 3A–3D show a second embodiment of the shimming method for an irregular object to be examined by magnetic resonant equipment according to the invention. FIG. 3A is a perspective view of the second embodiment of the shimming method for an irregular object to be examined by magnetic resonant equipment according to the invention. FIGS. 3B and 3C respectively are views in the directions 3B and 3C in FIG. 3A. FIG. 3D is a cross-sectional view of FIG. 3A.

This embodiment is similar to the first embodiment, with the difference that the flat top and bottom with circular cross-section are set respectively to the upper and lower parts of the spherically shaped homogeneous regions 30b formed between the upper and lower magnetic poles 10 and 20, so as to have more effective coverage of the irregular object to be examined. This reduces the volume of the homogeneous region that has no contribution to the image quality. At the same time a number of measurement points are set on the surface of this spherical shaped homogeneous region 30b and its flat top and bottom in order to measure its magnetic parameters.

Figure 4A:
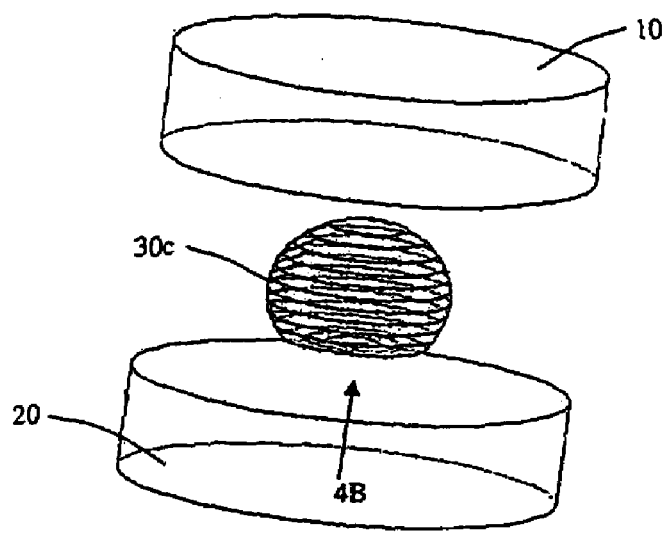
FIGS. 4A–4C are schematic diagrams of a third embodiment of the shimming method for an irregular object to be examined by magnetic resonant equipment according to the invention.
Figure 4B:
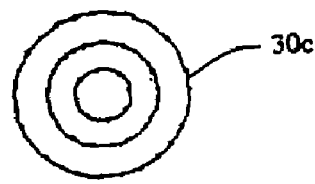
Figure 4C:
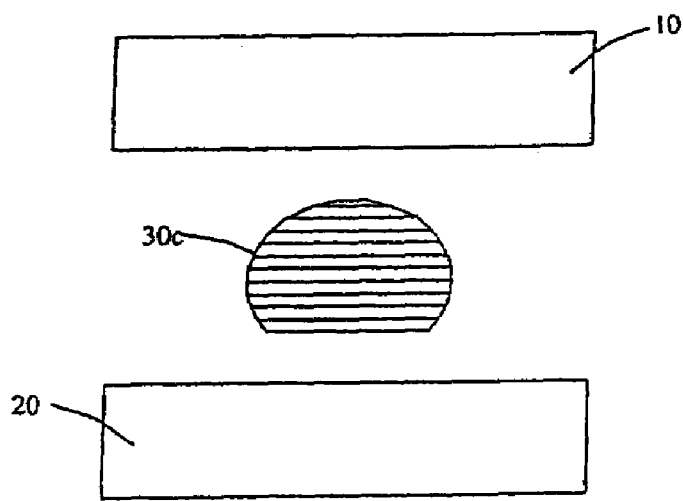

FIGS. 4A–4C show a third embodiment of the shimming method for an irregular object to be examined by magnetic resonant equipment according to the invention. FIG. 4A is a perspective view of the third embodiment of the shimming method for an irregular object to be examined by magnetic resonant equipment according to the invention. FIG. 4B is a view in the direction 4B in FIG. 4A. FIG. 4C is a cross-sectional view of FIG. 4A.

This embodiment is similar to the first embodiment, with the difference that an ellipsoidal shaped homogeneous region 30c is formed between the upper and lower magnetic poles 10 and 20 instead of the spherical shape in the first and second embodiments. This ellipsoidal shaped homogeneous region 30c can effectively reduce in the direction of its short axis the volume of the homogeneous region that has no contribution to the image quality. The lower part of this ellipsoidal shaped homogeneous region 30c is set as a flat bottom with a circular cross section, in order to have a more effective coverage of said irregular object to be examined. At the same time a number of measurement points are set on the surface of this ellipsoidal shaped homogeneous region 30c and its flat bottom in order to measure its magnetic parameters.

Figure 5A:
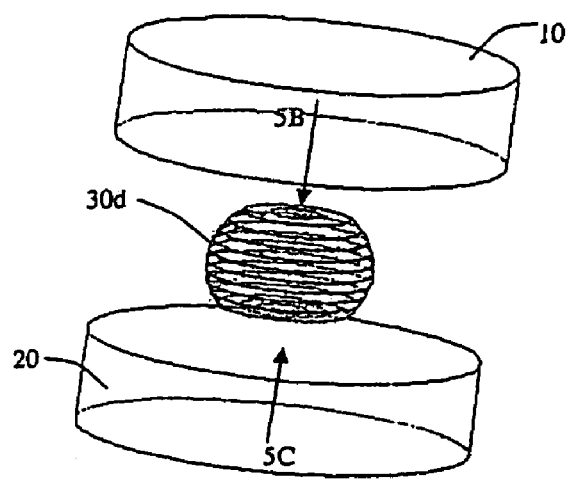
FIGS. 5A–5D are schematic diagrams of a fourth embodiment of the shimming method for an irregular object to be examined by magnetic resonant equipment according to the invention.
Figure 5B:
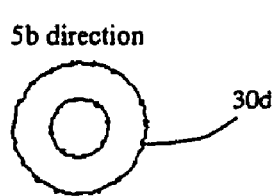
Figure 5C:
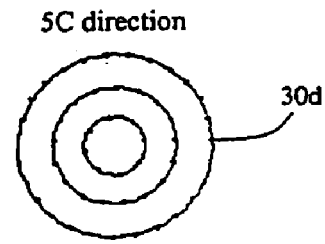
Figure 5D:
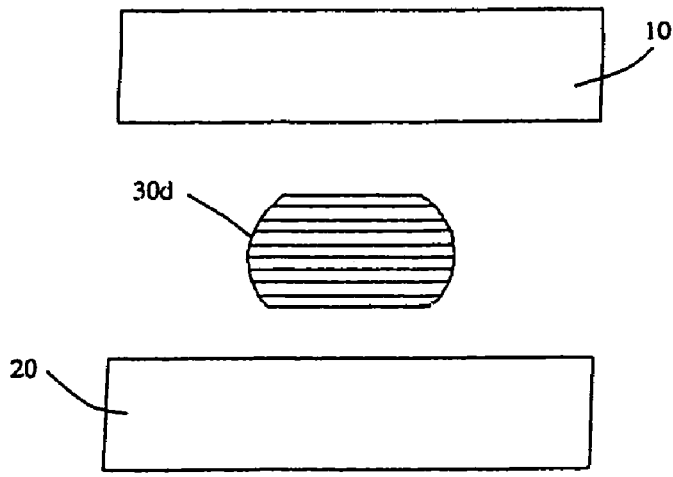

FIGS. 5A–5D show a fourth embodiment of the shimming method for an irregular object to be examined by magnetic resonant equipment according to the invention. FIG. 5A is a perspective view of the fourth embodiment of the shimming method for an irregular object to be examined by magnetic resonant equipment according to the invention. FIGS. 5B and 5C are respective views in the directions 5B and 5C in FIG. 5A. FIG. 5D is a cross-sectional view of FIG. 5A.

This embodiment is similar to the third embodiment with the difference that an ellipsoidal shaped homogeneous region 30d is formed between the upper and lower magnetic poles 10 and 20, and this ellipsoidal shaped homogeneous region 30d can effectively reduce in the direction of its short axis the volume of the homogeneous region which has no contribution to the image quality. The upper and lower parts of this spherical shaped homogeneous region 30d are respectively set with flat top and bottom with circular cross-section so as to have more effective coverage of said irregular object to be examined, and at the same time a number of measurement points are set on the surface of this spherical shaped homogeneous region 30d and its flat top and bottom in order to measure its magnetic parameters.

Figure 6A:
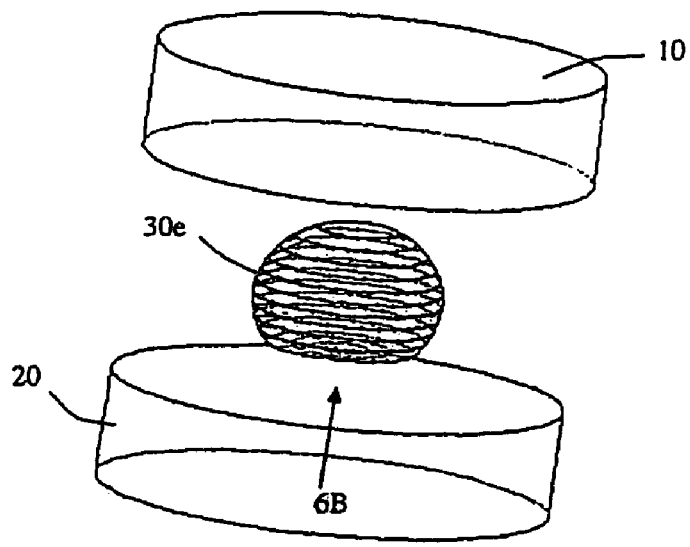
FIGS. 6A–6C are schematic diagrams of a fifth embodiment of the shimming method for an irregular object to be examined by magnetic resonant equipment according to the invention.
Figure 6B:
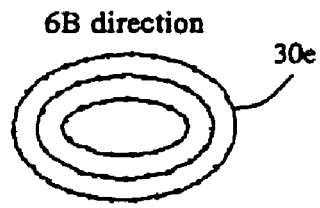
Figure 6C:
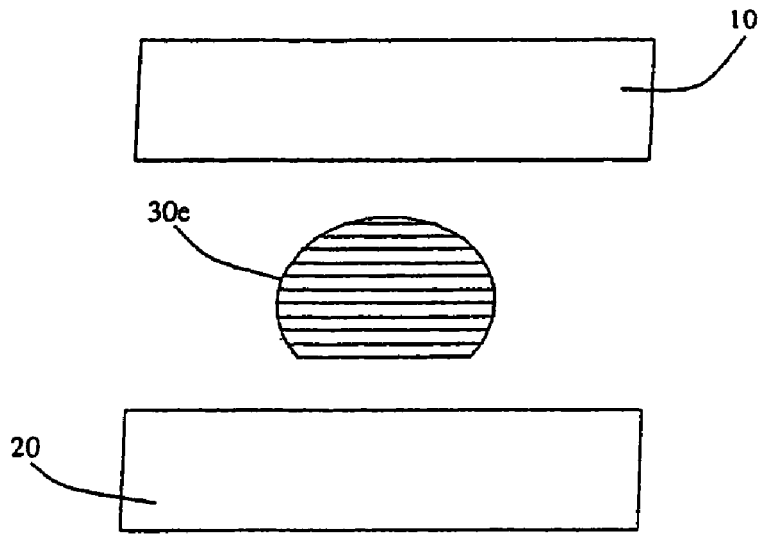

FIGS. 6A–6C show a fifth embodiment of the shimming method for an irregular object to be examined by magnetic resonant equipment according to this invention. FIG. 6A is a perspective view of the fifth embodiment of the shimming method for an irregular object to be examined by magnetic resonant equipment according to this invention. FIG. 6B is a view in the direction 6B in FIG. 6A. FIG. 6C is a cross-sectional view of FIG. 6A.

This embodiment is similar to the third embodiment with the difference being that an ellipsoidal shaped homogeneous region 30e is formed between the upper and lower magnetic poles 10 and 20, and the lower part of this ellipsoidal shaped homogeneous region 30e is set as a flat bottom with an elliptic cross-section so as to have more effective coverage of the irregular object to be examined. This reduces the volume of the homogeneous region that has no contribution to the image quality. At the same time a number of measurement points are set on the surface of this spherical shaped homogeneous region 30e and its flat bottom in order to measure its magnetic parameters.

Figure 7A:
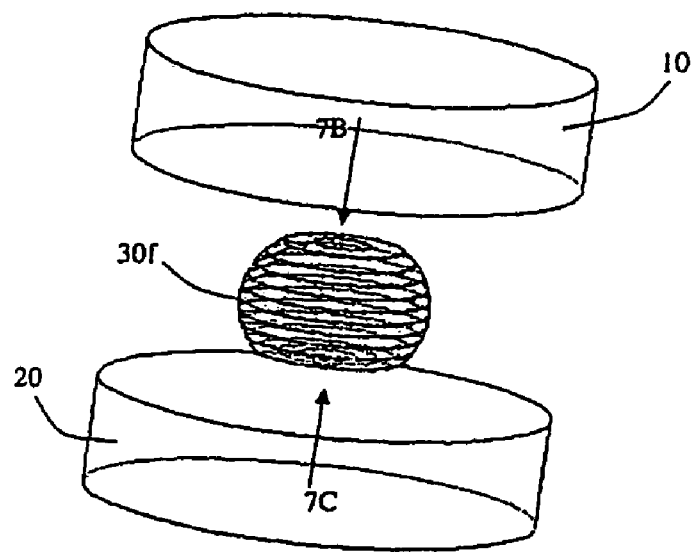
FIGS. 7A–7D are schematic diagrams of a sixth embodiment of the shimming method for an irregular object to be examined by magnetic resonant equipment according to the invention.
Figure 7B:
Figure 7C:
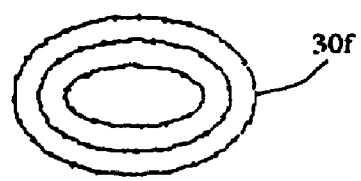
Figure 7D:
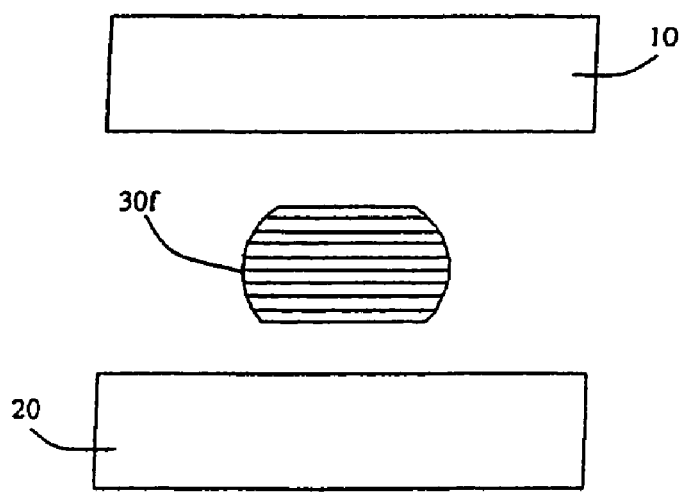

FIGS. 7A–7D show a sixth embodiment of the shimming method for an irregular object to be examined by magnetic resonant equipment according to the invention. FIG. 7A is a perspective view of the sixth embodiment of the shimming method for an irregular object to be examined by magnetic resonant equipment according to the invention. FIGS. 7B and 7C are respective views in the directions 7B and 7C in FIG. 7A. FIG. 7D is a cross-sectional view of FIG. 7A.

This embodiment is similar to the fifth embodiment, with the difference being that an ellipsoidal shaped homogeneous region 30f is formed between the upper end lower magnetic poles 10 and 20, and the upper and lower parts of this ellipsoidal shaped homogeneous region 30f are respectively set as a flat top with a circular cross-section and a flat bottom with an elliptic cross-section so as to have more effective coverage of said irregular object to be examined. This reduces the volume of the homogeneous region which has no contribution to the image quality; and at the same time a number of measurement points are set on the surface of this spherical shaped homogeneous region 30f and its flat top and bottom in order to measure its magnetic parameters.

Understandably, in the above embodiments of the shimming method for an irregular object to be examined by magnetic resonant equipment according to this invention, the homogeneous region can be adjusted according to circumstances into a spherical shape, an ellipsoidal shape, irregular shapes or any combination thereof, while the flat top and bottom can also be adjusted according to circumstances into circular shape, elliptic shape, other irregular shapes or any combination of them.

The above mentioned homogeneous regions can be achieved by the following method:

(1) Measuring the magnetic field on the surface of the irregular object to be examined via the measurement points at the slice planes, flat top and flat bottom of the irregular object to be examined;

(2) Obtaining the following parameters by the measurement in the step (1) of:
 (a) field variation
 (b) an ellipsoidal harmonic factor
 (c) a spherical harmonic factor
 (d) a magnetic field peak to peak value optimizing the parameters by using a mathematical optimization method, such as a linear programming method, wherein these parameters can be used individually, in combination, as a target function and as a constraint; and calculating the positions and number of shims for adjusting magnetic field homogeneity when a passive shimming is to be performed, or calculating the current value in a shimming coil when an active shimming is to be performed, or calculating at the same time both said positions and number of shims and current value in the shimming coil when active shimming and passive shimming are to be performed at the same time;

(3) Performing shimming according to the calculated results;

(4) Repeating the steps (1) to (3) until achieving required magnetic field homogeneity.

By using the shimming method for an irregular object to be examined by magnetic resonant equipment according to this invention to design the homogeneous region, it can achieve the following advantages;

(1) Since the homogenous region is designed to be an irregular shape, it can therefore provide a better coverage of the irregular object to be examined, and at the same time reduce the shimming constraints in the unnecessary regions outside the irregular object to be examined, thus it avoids performing shimming to the unnecessary regions, which helps to improve the magnetic field homogeneity within the region of said irregular object to be examined, so to improve the image quality.

(2) Due to the volume reduction of the homogeneous region, it leads to the reduction or decrease of the size, weight and complexity of the magnets in the magnetic resonant equipment, therefore its openness is improved and also the manufacturing costs of the magnetic resonant equipment are reduced accordingly.

(3) Since the homogeneous regions outside the image region, which have no contribution to the image quality, are eliminated, the magnetic field homogeneity within the irregular homogeneous region can have a more accurate reflection of the influence on the image quality by the field homogeneity.

Although modifications and changes may be suggested by those skilled in the art, it is the intention of the inventors to embody within the patent warranted hereon all changes and modifications as reasonably and properly come within the scope of their contribution to the art.

We claim as our invention:

1. A shimming method for an irregular object to be examined by magnetic resonant equipment, characterized by comprising the steps of:
    (1) measuring magnetic field parameters at measurement points located on a surface of an irregular object to be examined in magnetic resonance equipment;
    (2) based on the measured magnetic field parameters, calculating a calculated result selected from the group consisting of positions and number of shims for adjusting a shape of a homogeneous magnetic field volume in said magnetic resonance equipment and the homogeneity of the homogenous magnetic field volume when a passive shimming is to be performed, calculating a current value in a shimming coil for adjusting a shape of a homogenous magnetic field volume in said magnetic resonance equipment and the homogeneity of the homogenous magnetic field volume when an active shimming is to be performed, and calculating both said positions and number of shims and said current value in the shimming coil for adjusting a shape of a homogenous magnetic field volume in said magnetic resonance equipment and the homogeneity of the homogenous magnetic field volume when active shimming and passive shimming are to be performed together, and in each case performing said adjusting to give said shape of said homogeneous magnetic field volume at least one of a flat exterior bottom and a flat exterior top;
    (3) performing shimming according to said calculated result; and
    (4) repeating steps (1) to (3) until achieving a predetermined magnetic field homogeneity.

2. A shimming method for an irregular object to be examined by magnetic resonant equipment as claimed in claim 1, comprising selecting said shims from the group consisting of soft magnetic shims, hard magnetic shims, and a combination of soft and hard magnetic shims used together.

3. A shimming method for an irregular object to be examined by magnetic resonant equipment as claimed in claim 1, comprising in each case adjusting the shape of the homogeneous from the group consisting of spherical, ellipsoidal and irregular shapes having said at least one of a flat exterior bottom and a flat exterior top.

4. A shimming method for an irregular object to be examined by magnetic resonant equipment as claimed in claim 1, comprising adjusting said shape of said homogenous magnetic field volume to have a flat exterior bottom and setting said measurement points on a surface corresponding to said flat bottom.

5. A shimming method for an irregular object to be examined by magnetic resonant equipment as claimed in claim 1, comprising adjusting said shape of said homogenous magnetic field volume to have a flat exterior top and setting said measurement points on a surface corresponding to said flat top.

6. A shimming method for an irregular object to be examined by magnetic resonant equipment as claimed in claim 1, comprising selecting said magnetic field parameters from the group consisting of magnetic field variation, an ellipsoidal harmonic factor, a spherical harmonic factor and a magnetic field peak-to-peak value.

7. A shimming method for an irregular object to be examined by magnetic resonant equipment as claimed in claim 6, comprising calculating said calculated result using said magnetic field parameters in a manner selected from the group consisting of individually, in combination, as a target function and as a constraint.

8. A shimming method for an irregular object to be examined by magnetic resonant equipment as claimed in claim 7, comprising calculating said calculated result using a mathematical optimization method.

9. A shimming method for an irregular object to be examined by magnetic resonant equipment as claimed in claim 8, comprising using a linear programming method as said mathematical optimization method.

* * * * *